United States Patent
Tu et al.

(10) Patent No.: US 11,087,708 B2
(45) Date of Patent: Aug. 10, 2021

(54) METHOD FOR TRANSMITTING DATA FROM TIMING CONTROLLER TO SOURCE DRIVER AND ASSOCIATED TIMING CONTROLLER AND DISPLAY SYSTEM

(71) Applicant: HIMAX TECHNOLOGIES LIMITED, Tainan (TW)

(72) Inventors: Mong-Hua Tu, Tainan (TW); Peng-Chi Chen, Tainan (TW); Chih-Hsiang Lin, Tainan (TW); Yin-Ho Chiang, Tainan (TW); Jen-Chieh Liu, Tainan (TW); Shih-Po Chen, Tainan (TW); Cheng-Yu Shih, Tainan (TW); Chien-Lung Cho, Tainan (TW); Yi-Ping Tu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/431,741

(22) Filed: Jun. 5, 2019

(65) Prior Publication Data
US 2020/0388237 A1 Dec. 10, 2020

(51) Int. Cl.
*G09G 3/36* (2006.01)
*H03K 3/00* (2006.01)
*H03L 7/00* (2006.01)

(52) U.S. Cl.
CPC .............. *G09G 3/3685* (2013.01); *H03K 3/00* (2013.01); *H03L 7/00* (2013.01); *G09G 2310/08* (2013.01); *G09G 2320/0233* (2013.01); *G09G 2330/06* (2013.01)

(58) Field of Classification Search
CPC .......... G09G 3/3685; H03K 3/00; H03L 7/00
USPC ............................................................. 345/99
See application file for complete search history.

(56) References Cited

U.S. PATENT DOCUMENTS

| | | | |
|---|---|---|---|
| 2012/0169686 A1* | 7/2012 | Kim ................. | G09G 5/008 345/208 |
| 2016/0042682 A1* | 2/2016 | Lim .................. | H04N 5/63 345/212 |
| 2016/0203802 A1* | 7/2016 | Hong ................ | G09G 5/003 345/534 |
| 2017/0069289 A1* | 3/2017 | Oh ................... | G09G 5/006 |
| 2019/0173454 A1* | 6/2019 | Jun .................. | H03L 7/197 |
| 2019/0244556 A1* | 8/2019 | Yoon ................ | G09G 3/2096 |

FOREIGN PATENT DOCUMENTS

| | | |
|---|---|---|
| CN | 109345996 A | 2/2019 |
| CN | 109639259 A | 4/2019 |
| TW | 201629942 A | 8/2016 |

* cited by examiner

*Primary Examiner* — Kwin Xie
(74) *Attorney, Agent, or Firm* — Winston Hsu

(57) ABSTRACT

The present invention provides a method for transmitting data from a timing controller to a source driver, wherein the method includes the steps of: applying a plurality of data rates to a discrete data rate setting; and transmitting image data of a plurality of frames by using a plurality of modulated data rates, respectively; wherein the plurality of modulated data rates are generated by performing spread-spectrum clocking (SSC) upon the plurality of data rates, respectively; and for each of the frames, its corresponding image data is transmitting by using only one of the modulated data rates.

20 Claims, 8 Drawing Sheets

METHOD FOR TRANSMITTING DATA FROM TIMING CONTROLLER TO SOURCE DRIVER AND ASSOCIATED TIMING CONTROLLER AND DISPLAY SYSTEM

BACKGROUND OF THE INVENTION

1. Field of the Invention

The present invention relates to display system, and more particularly, to a method for transmitting data from a timing controller to a source driver and associated timing controller and display system.

2. Description of the Prior Art

In a conventional point-to-point (P2P) timing controller, frame data is transmitted to a plurality of source drivers by using a single data rate. However, using a single data rate to transmit will cause a high electromagnetic interference (EMI) peak. In addition, although the EMI peak can be reduced by using the spread spectrum techniques, the effect may not be enough when the system suffers sever EMI.

In addition, charging time of each thin-film transistor within a liquid crystal display (LCD) panel becomes fewer due to the higher resolution of LCD panel, and the thin-film transistors may not be fully charged so that the charging time between the lines of the LCD panel have deviation, causing the line luminance deviation and wavy issue on the LCD panel.

SUMMARY OF THE INVENTION

It is therefore an objective of the present invention to provide a method for transmitting data from a timing controller to a source driver and associated timing controller and display system, which uses different modulated data rates to transmit image data to effectively reduce the EMI peak and improve the wavy issue, to solve the above-mentioned problems.

According to one embodiment of the present invention, a method for transmitting data from a timing controller to a source driver is provided, wherein the method includes the steps of: applying a plurality of data rates to a discrete data rate setting; and transmitting image data of a plurality of frames by using a plurality of modulated data rates, respectively; wherein the plurality of modulated data rates are generated by performing spread-spectrum clocking (SSC) upon the plurality of data rates, respectively; and for each of the frames, its corresponding image data is transmitting by using only one of the modulated data rates.

According to another embodiment of the present invention, a timing controller of a display is provided. In the operations of the timing controller, the timing controller is configured to apply a plurality of data rates to a discrete data rate setting, and transmit image data of a plurality of frames by using a plurality of modulated data rates, respectively; wherein the plurality of modulated data rates are generated by performing SSC upon the plurality of data rates, respectively; and for each of the frames, its corresponding image data is transmitting by using only one of the modulated data rates.

According to another embodiment of the present invention, a display system comprising a timing controller and at least one source driver is provided. In the operations of the timing controller, the timing controller is configured to apply a plurality of data rates to a discrete data rate setting, and transmit image data of a plurality of frames by using a plurality of modulated data rates, respectively; wherein the plurality of modulated data rates are generated by performing SSC upon the plurality of data rates, respectively; and for each of the frames, its corresponding image data is transmitting by using only one of the modulated data rates.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
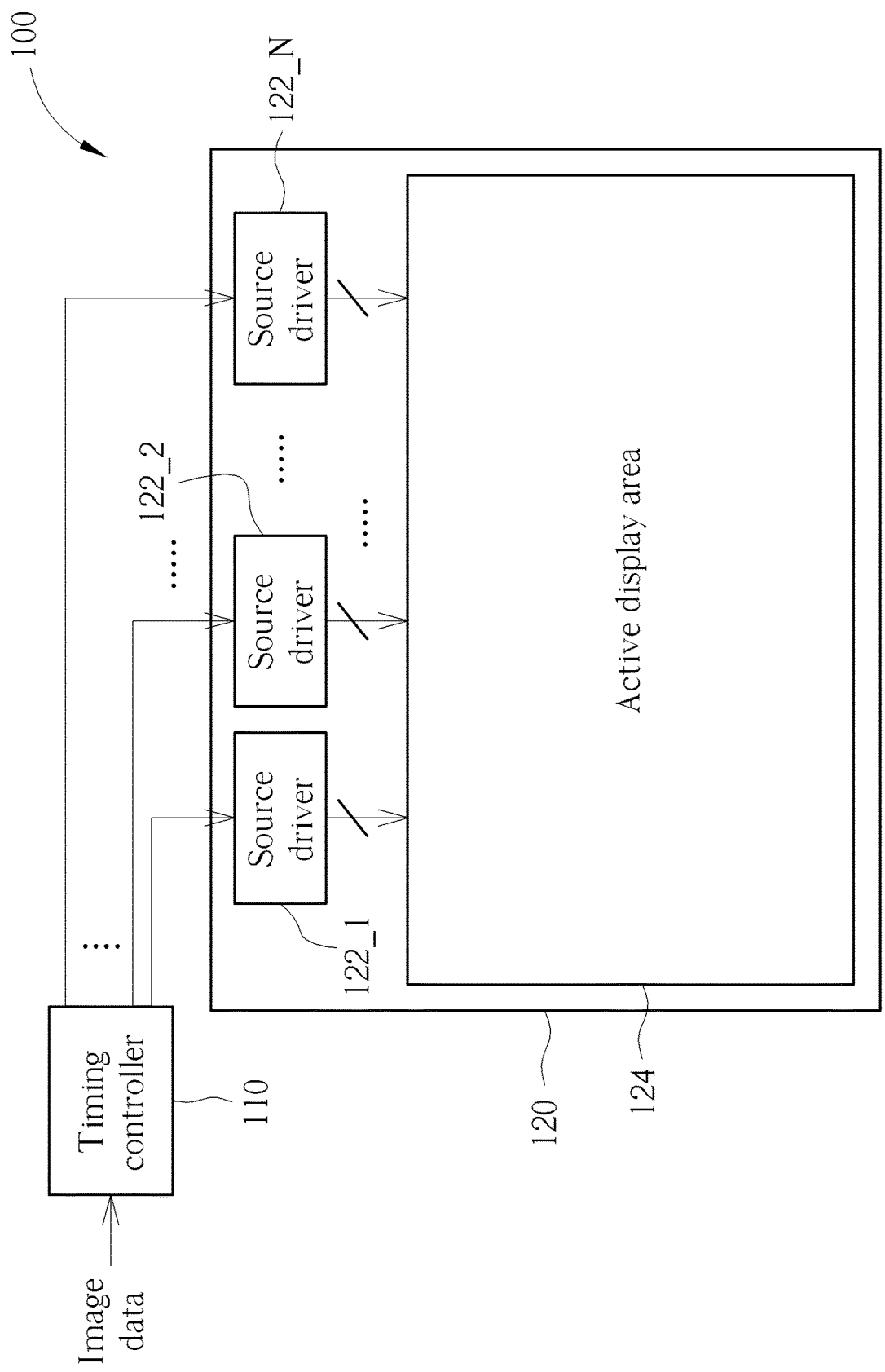
FIG. 1 is a diagram illustrating a display system according to one embodiment of the present invention.

Please refer to FIG. 1, which is a diagram illustrating a display system 100 according to one embodiment of the present invention. As shown in FIG. 1, the display system 100 comprises a timing controller 110 and a display panel 120, where the display panel 120 comprises at least one source driver (in this embodiment there are a plurality of source drivers 122_1-122_N) and an active display area 124 (the active display area 124 is also named as an active array). In this embodiment, the timing controller 110 is a P2P timing controller, and the timing controller 110 uses a Serializer/Deserializer (SerDes) interface to transmit frame data to the source drivers 122_1-122_N, respectively, and the display system 100 may be a liquid crystal display (LCD).

In the operations of the display system 100, first, the timing controller 110 applies a plurality of data rates to a discrete data rate setting. Then, the timing controller 110 sequentially receives image data of a plurality of frames, and transmits the (processed) image data of the plurality of frames to each of the source drivers 122_1-122_N by using a plurality of modulated data rates, respectively, where the plurality of modulated data rates are generated by performing spread-spectrum clocking (SSC) upon the plurality of data rates, respectively; and for each of the frames, its corresponding image data is transmitting by using only one of the modulated data rates. Then, after receiving the image data from the timing controller 110, the source drivers 122_1-122_N transmits corresponding data to data lines of the active display area 124.

Figure 2:
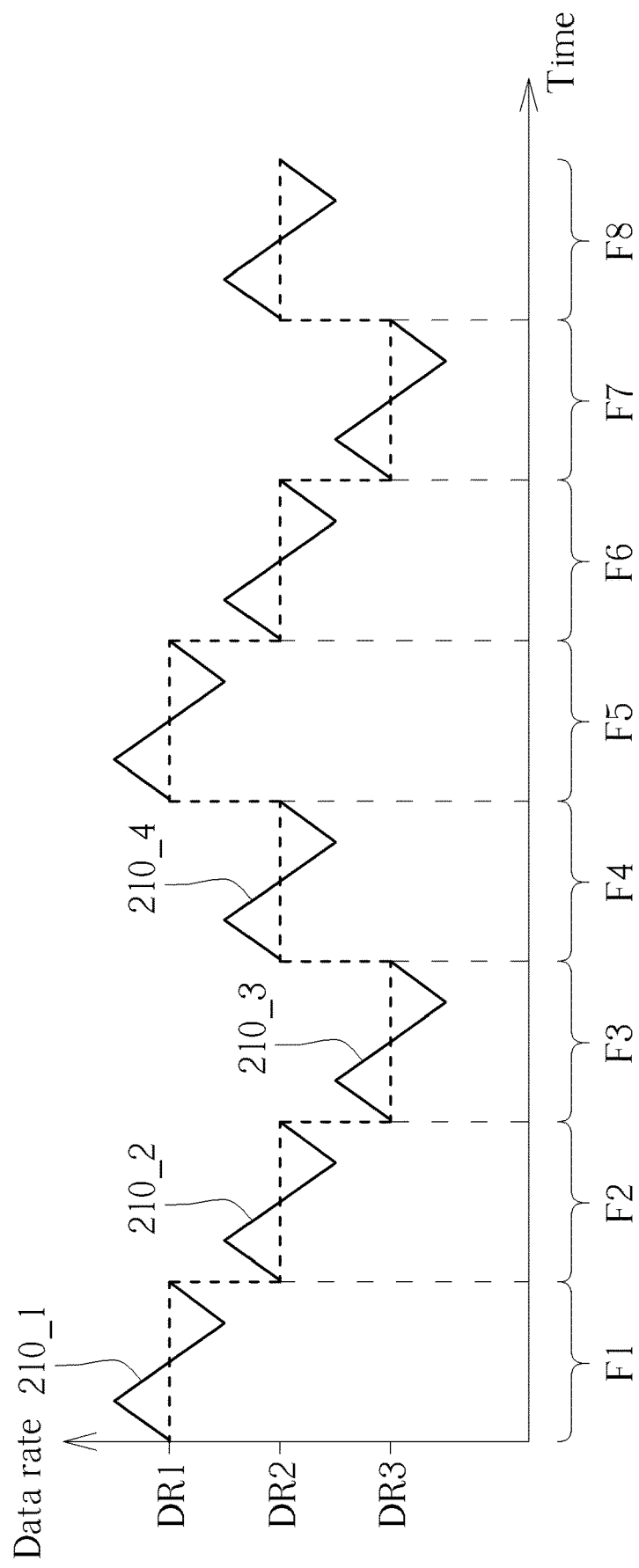
FIG. 2 shows transmitting frames by using a plurality of modulated data rates according to one embodiment of the present invention.

In detail, refer to FIG. 2 which shows transmitting frames by using the modulated data rates 210_1-210_4 according to one embodiment of the present invention. Referring to FIG. 2, the timing controller 110 uses the modulated data rate 210_1 to transmit image data of the frame F1 to the source drivers 122_1-122_N, uses the modulated data rate 210_2 to transmit image data of the frame F2 to the source drivers 122_1-122_N, uses the modulated data rate 210_3 to transmit image data of the frame F3 to the source drivers 122_1-122_N, uses the modulated data rate 210_4 to transmit image data of the frame F4 to the source drivers 122_1-122_N, and repeatedly and sequentially uses the modulated data rates 210_1-210_4 to transmit the following frames F5, F6, F7, F8, respectively, . . . . By using different modulated data rates to transmit the frame data, the EMI peak can be effectively reduced. In this embodiment, the modulated data rate 210_1 may be generated by performed SSC based on a data rate DR1 (i.e. the data rate DR1 is a center data rate of the modulated data rate 210_1) to have a variable data rate; the modulated data rate 210_2 may be generated by performed SSC based on a data rate DR2 (i.e. the data rate DR2 is a center data rate of the modulated data rate 210_2) to have a variable data rate; the modulated data rate 210_3 may be generated by performed SSC based on a data rate DR3 (i.e. the data rate DR3 is a center data rate of the modulated data rate 210_3) to have a variable data rate; and the modulated data rate 210_4 may be generated by performed SSC based on a data rate DR2 (i.e. the data rate DR2 is a center data rate of the modulated data rate 210_4) to have a variable data rate.

It is noted that FIG. 2 is merely for illustrative purposes only, and is not a limitation of the present invention. For example, quantity of of data rates and/or quantity of modulated data rates can be determined according to the designer's consideration. In addition, FIG. 2 shows that the image data of any two adjacent frames is transmitted by using different modulated data rates, respectively, however, in other embodiments, the image data of some adjacent frames can be transmitted by using the same modulated data rate, for example, using the modulated data rate 210_1 to transmit the frames F1-F2 and F4-F5, and using the modulated data rate 210_2 to transmit the frames F3 and F6. In other embodiments, the modulated data rates or the data rated are not periodically used to transmit the image data of the frames. These alternative designs shall fall within the scope of the present invention.

Figure 3:
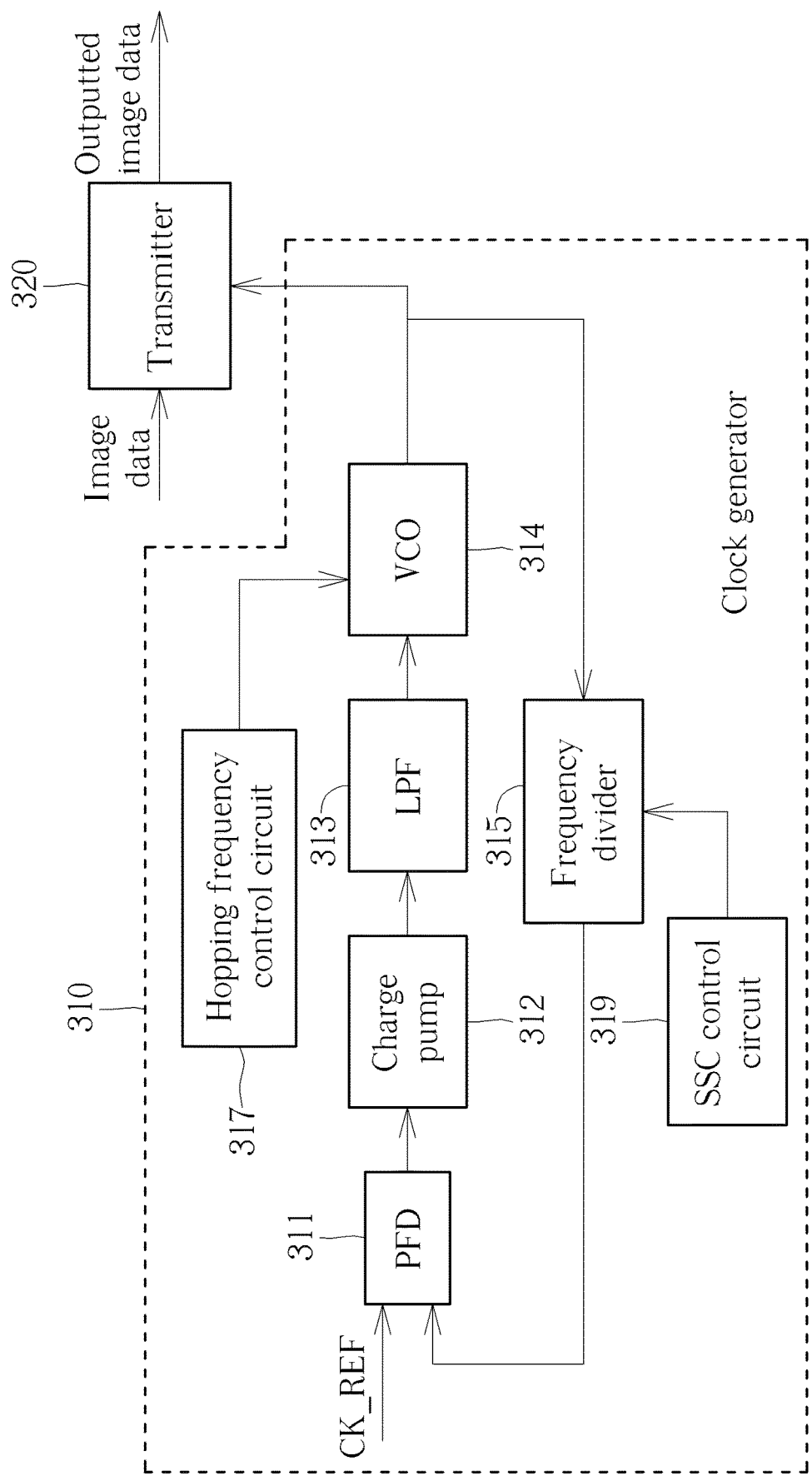
FIG. 3 is a diagram illustrating a clock generator and a transmitter within the timing controller according to one embodiment of the present invention.

FIG. 3 is a diagram illustrating a clock generator 310 and a transmitter 320 within the timing controller 110 according to one embodiment of the present invention. As shown in FIG. 3, the clock generator 310 comprises a phase and frequency detector (PFD) 311, a charge pump 312, a low-pass filter 313, an oscillator such as a voltage-controlled oscillator (VCO) 314, a frequency divider 315, a hopping frequency control circuit 317 and a SSC control circuit 319. In the operations of the clock generator 310, the PFD 311 receives a reference signal CK_REF and a feedback signal CK_FB to generate a detection result, the charge pump 312 generates a control signal Vc according to the detection result, the low-pass filter 313 filters the control signal Vc to generate a filtered control signal Vc', and the VCO 314 generates a clock signal CK according to the filtered control signal Vc', and the frequency divider 315 divides the clock signal CK to generate the feedback signal CK_FB. In this embodiment, the hopping frequency control circuit 317 is configured to send a data rate setting DRC to control the VCO 314 to generate the clock signal CK whose center frequency is equal to one of the data rates DR1-DR3 shown in FIG. 2, and the SSC control circuit 319 is configured to control the frequency divider 315 to constantly change a frequency of the feedback signal CK_FB to make the clock signal CK whose frequency is equal to one of the modulated data rates 210_1-210_4. In detail, if the image data of the frame F1 is to be transmitted to the source drivers 122_1-122_N, the hopping frequency control circuit 317 can control the VCO 314 to have the center frequency that is equal to the data rate DR1, and the SSC control circuit 319 can control the frequency divider 315 to make the feedback signal CK_FB have the variable frequency to make the clock signal CK whose frequency (variable frequency) is equal to the modulated data rate 210_1 as shown in FIG. 2; if the image data of the frame F2 is to be transmitted to the source drivers 122_1-122_N, the hopping frequency control circuit 317 can control the VCO 314 to have the center frequency that is equal to the data rate DR2, and the SSC control circuit 319 can control the frequency divider 315 to make the feedback signal CK_FB have the variable frequency to make the clock signal CK whose frequency (variable frequency) is equal to the modulated data rate 210_2 as shown in FIG. 2; and if the image data of the frame F3 is to be transmitted to the source drivers 122_1-122_N, the hopping frequency control circuit 317 can control the VCO 314 to have the center frequency that is equal to the data rate DR3, and the SSC control circuit 319 can control the frequency divider 315 to make the feedback signal CK_FB have the variable frequency to make the clock signal CK whose frequency (variable frequency) is equal to the modulated data rate 210_3 as shown in FIG. 2.

Then, the transmitter 320 uses the clock signal CK to transmit the image data, that is the outputted image data with the modulated data rate is transmitted to the source drivers 122_1-122_N.

In the above-mentioned embodiment, the hopping data rates and the SSC are used together to greatly reduce the EMI peak to improve the data quality, however, this control mechanism needs higher power consumption. Therefore, in order to lower the power consumption when the EMI peak is not severe, one of the hopping data rates and the SSC may be disabled. Specifically, the hopping frequency control circuit 317 may be disabled so that the SSC is performed based on the same center frequency, and the image data of the frames F1-F8 are transmitted within the same modulated data rate shown in FIG. 4. In another embodiment, the SSC control circuit 319 may be disabled so that the frames F1-F8 are transmitted by using the data rates DR1, DR2, DR3, DR2, DR1, DR2, DR3, DR2, respectively, as shown in FIG. 5.

Figure 6:
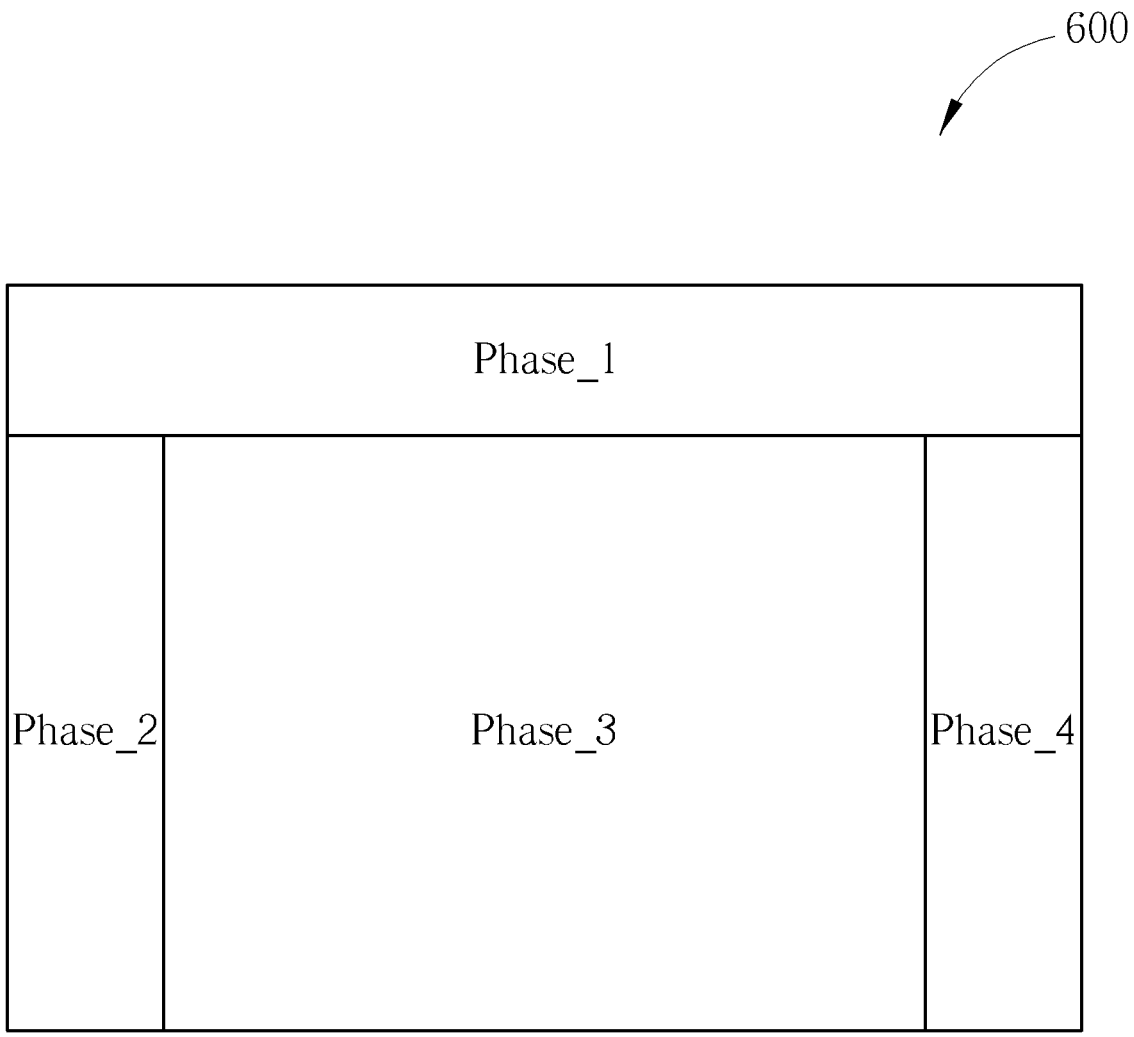
FIG. 6 is a diagram illustrating a format of a frame according to one embodiment of the present invention.
Figure 7:
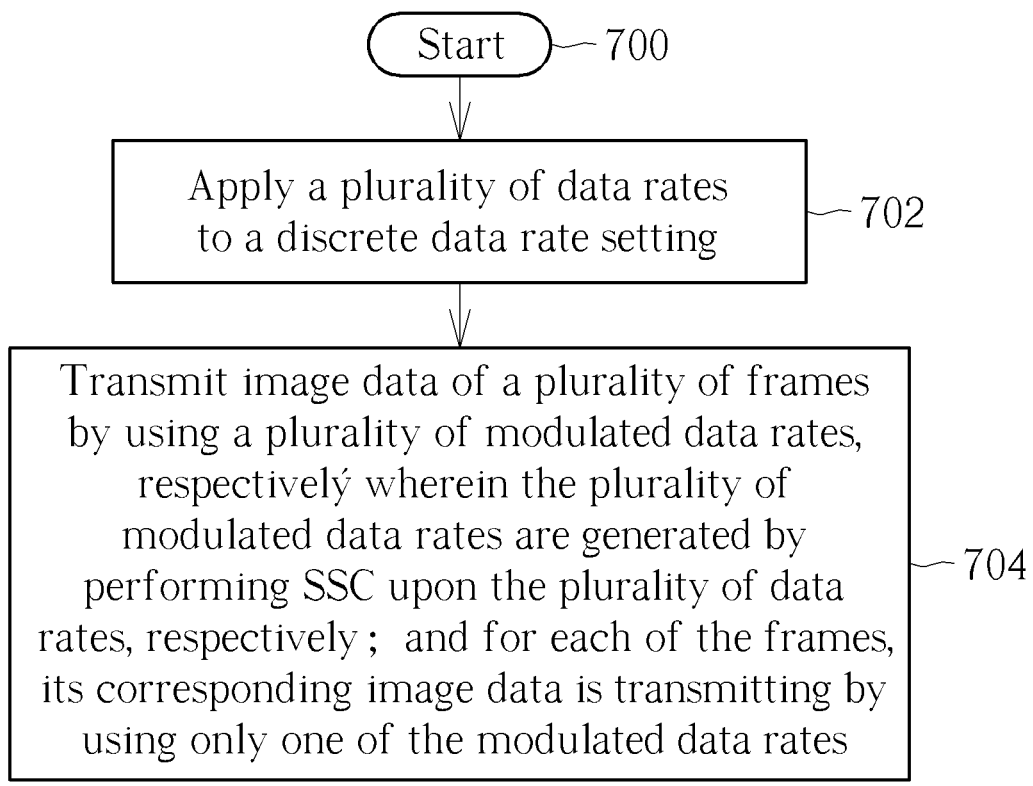
FIG. 7 is a flowchart of a method for transmitting data from a timing controller to a source driver according to one embodiment of the present invention.

FIG. 6 is a diagram illustrating a format of a frame 600 according to one embodiment of the present invention. Referring to FIG. 6, the frame 600 comprises active image data and inactive data, the active image data is used to be displayed on the active display area 124, that is "Phase_3" shown in FIG. 6; and the inactive data is not displayed on the active display area 124, that is the vertical blanking interval (VBI) data, that is "Phase_1" shown in FIG. 6, and the horizontal blanking interval (HBI) data, that is "Phase_2" and "Phase_4" shown in FIG. 6. In this embodiment, the timing controller 110 switches the center data rate when preparing to transmit the VBI data to the source drivers 122_1-122_N.

In addition, in this embodiment, for each frame to be transmitted to the source drivers 122_1-122_N, data amount of the image data of the frame is adjusted by referring to the data rate that is used to transmit the frame, especially for any two frames, the frame to be transmitted with higher data rate has greater data amount. In detail, for each frame, data amount of the inactive data, such as the VBI data and/or the HBI data, of the frame is increased or decreased by referring to the data rate that is used to transmit the image data of the frame.

Taking FIG. 2 as an example, assuming that the image data of each frame inputted into the timing controller 110 has a frame size 2040*1100, the timing controller 110 will add four lines of VBI data to the frame F1, that is the frame F1 has the frame size 2044*1100, and uses the modulated data rate 210_1 to transmit the frame F1; then the timing controller 110 will add two lines of VBI data to the frame F2, that is the frame F2 has the frame size 2042*1100, and uses the modulated data rate 210_2 to transmit the frame F2; then the timing controller 110 does not adjust the data amount of the frame F3, that is the frame F3 has the frame size 2040*1100, and uses the modulated data rate 210_3 to transmit the frame F3 . . . and so one.

For another example, assuming that the image data of each frame inputted into the timing controller 110 has a frame size 2040*1100, the timing controller 110 may increase HBI data to make the frame F1 have the frame size 2040*1102, and uses the modulated data rate 210_1 to transmit the frame F1; then the timing controller 110 may not adjust the frame F2, that is the frame F2 has the frame size 2040*1100, and uses the modulated data rate 210_2 to transmit the frame F2; then the timing controller 110 decrease HBI data to make the frame F3 has the frame size 2040*1098, and uses the modulated data rate 210_3 to transmit the frame F3 . . . and so one.

By switching the data rate of when preparing to transmit the VBI data, and adjusting data amount of the VBI data of the frame, the active display area 124 will not have flash points.

Figure 4:
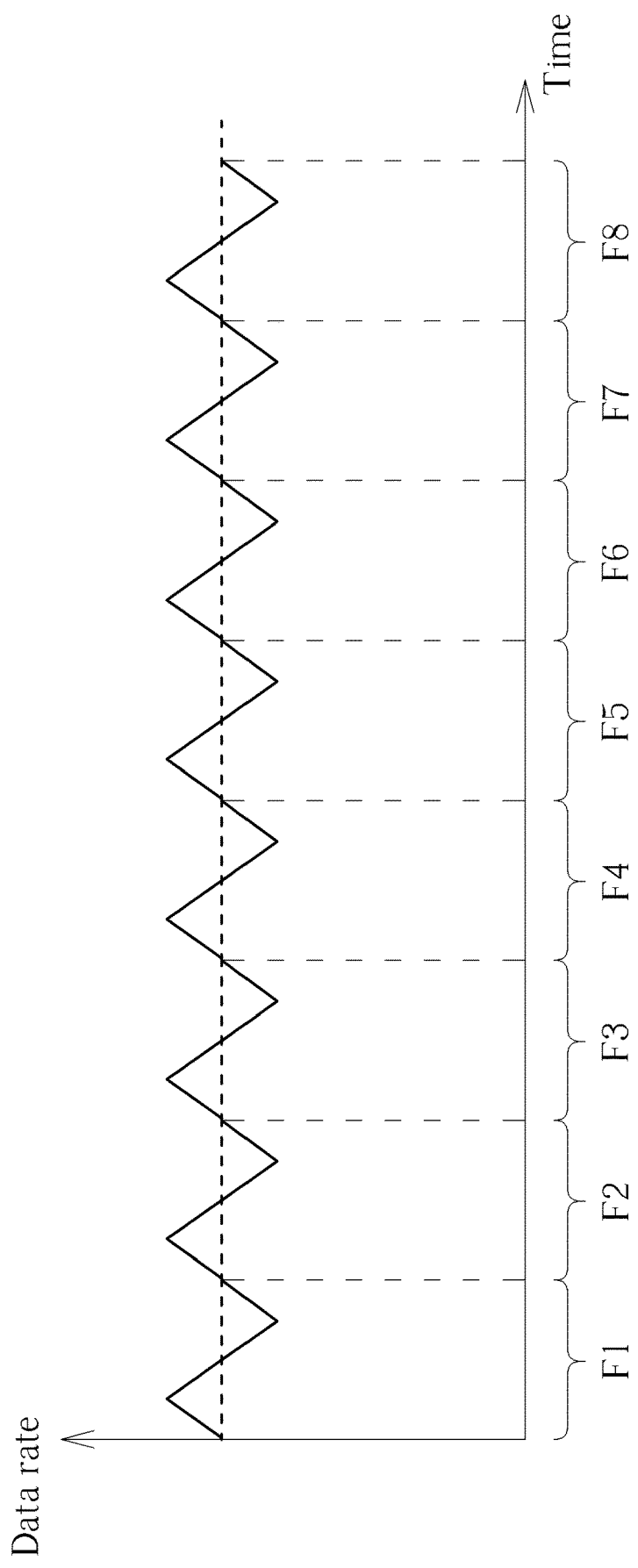
FIG. 4 shows transmitting frames by using a plurality of modulated data rates when the hopping frequency control circuit is disabled according to one embodiment of the present invention.
Figure 5:
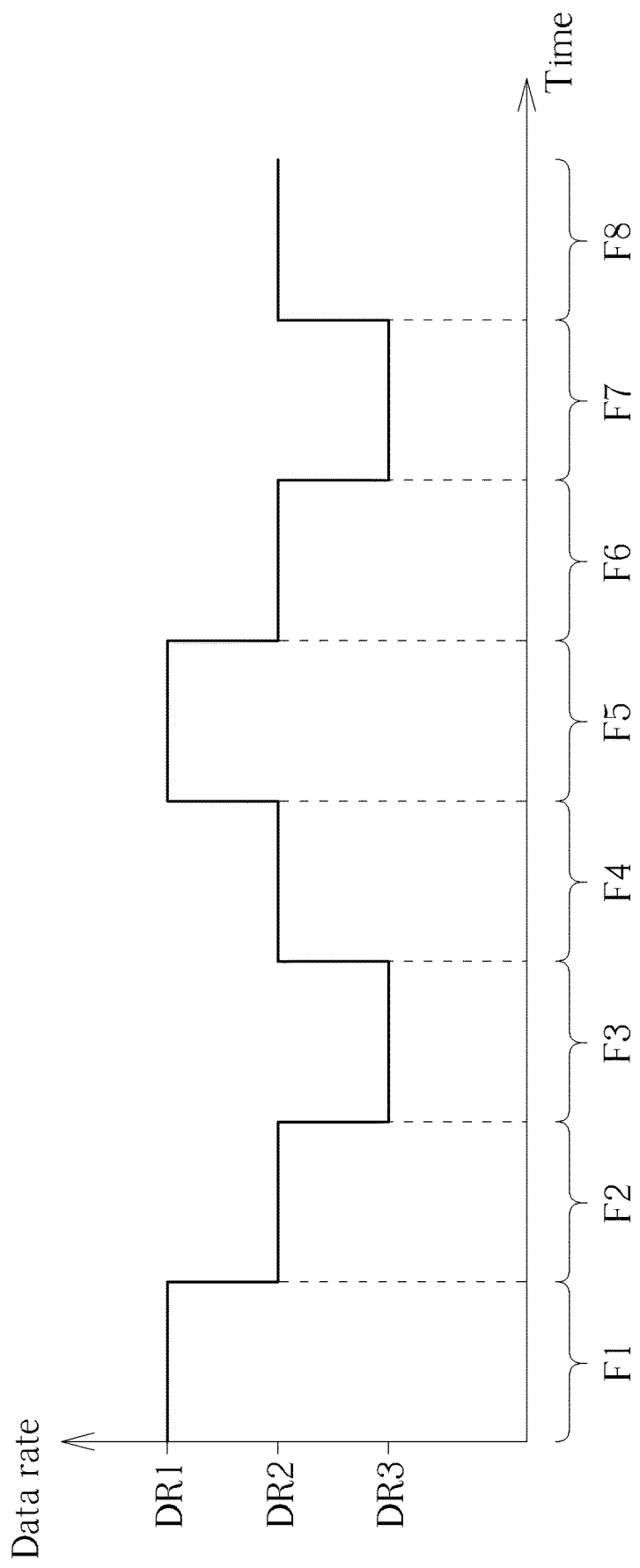
FIG. 5 shows transmitting frames by using a plurality of modulated data rates when the SSC control circuit is disabled according to one embodiment of the present invention.

Please refer FIG. 1-FIG. 7 together, FIG. 4 is a flowchart of a method for transmitting data from a timing controller to a source driver according to one embodiment of the present invention. Referring to FIG. 4, the flow is as follows:

Step 700: the flow starts.

Step 702: apply a plurality of data rates to a discrete data rate setting.

Step 704: transmit image data of a plurality of frames by using a plurality of modulated data rates, respectively; wherein the plurality of modulated data rates are generated by performing SSC upon the plurality of data rates, respectively; and for each of the frames, its corresponding image data is transmitting by using only one of the modulated data rates.

Figure 8:
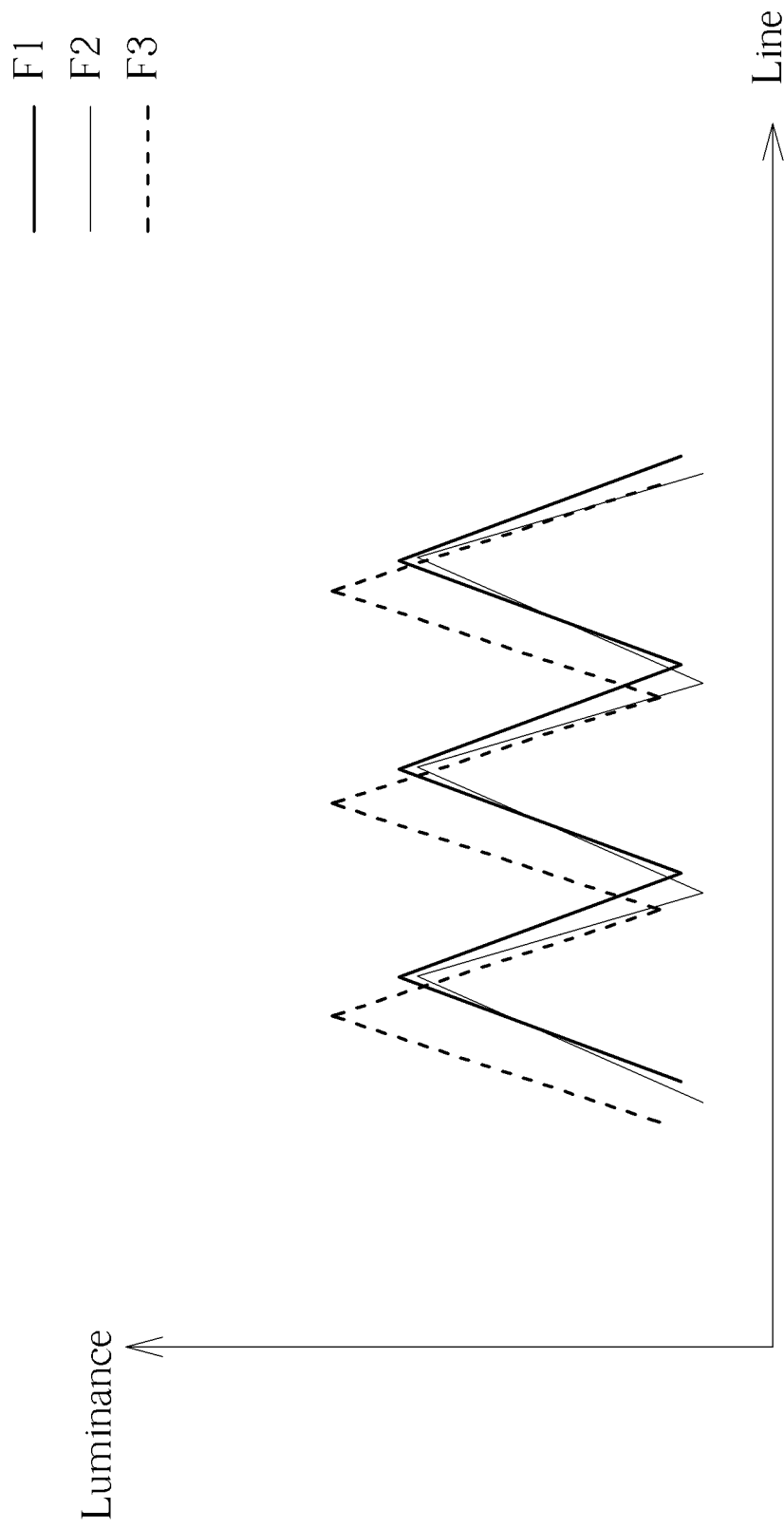
FIG. 8 shows that the frames have different luminance distribution by using the hopping frequency control and the SCC according to one embodiment of the present invention.

In addition, because both the hopping frequency control and the SSC are used to generate the modulated data rate to transmit the image data, the regulation of the line luminance deviation is broken to improve the wavy issue. In detail, referring to FIG. 8 which shows the lamination of the lines (horizontal lines) of the display panel 120 when the frames F1, F2 and F3 are displayed, because the frames F1, F2 and F3 have different luminance distribution instead of the regular luminance distribution in the prior art, the luminance between the lines become less obvious, and the wavy issue is improved.

Briefly summarized, in the present invention, the timing controller has a discrete data rate setting with the SSC, and the timing controller transmits image data of a plurality of frames by using the plurality of modulated data rates, respectively. By using the method for transmitting data from a timing controller to a source driver and associated timing controller and display system of the present invention, the EMI peak and the wavy issue can be greatly reduced.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A method for transmitting data from a timing controller to a source driver, comprising:
    applying a plurality of data rates to a discrete data rate setting, wherein the plurality data rates are not all the same; and
    transmitting image data of a plurality of consecutive frames by using a plurality of modulated data rates, respectively, wherein for the transmission of each frame, a clock generator is controlled to generate a clock signal whose frequency is equal to a center frequency of the corresponding modulated data rate, and the timing controller uses the clock signal to transmit the frame;
    wherein the plurality of modulated data rates are generated by performing spread-spectrum clocking (SSC) upon the plurality of data rates, respectively; and for each of the frames, its corresponding image data is transmitting by using only one of the modulated data rates;
    wherein the plurality of data rates comprise at least a first data rate and a second data rate, the first data rate and the second data rate are discrete data rates, the plurality of modulated data rates comprise a first modulated data rate and a second modulated data rate, the first modulated data rate and the second modulated data rate are used to transmit two consecutive frames, respectively; and the first modulated data rate is generated by performing the SSC upon the first data rate serving as the center frequency of the first modulated data rate, and the second modulated data rate is generated by performing the SSC upon the second data rate serving as the center frequency of the second modulated data rate.

2. The method of claim 1, wherein the plurality of data rates serve as center frequencies of the plurality of modulated data rates, respectively.

3. The method of claim 1, wherein the image data of any two adjacent frames is transmitted by using different modulated data rates having different center frequencies, respectively.

4. The method of claim 1, wherein the step of transmitting image data of the plurality of frames by using the plurality of modulated data rates, respectively comprises:
    repeatedly and sequentially using the plurality of modulated data rates to transmit the image data of the plurality of frames.

5. The method of claim 1, further comprising:
    for each frame to be transmitted to the source driver, adjusting data amount of the image data of the frame by referring to the modulated data rate that is used to transmit the image data of the frame.

6. The method of claim 5, wherein each frame comprises active image data and inactive data, the active image data is used to be displayed on an active display area of a display panel, the inactive data is not displayed on the active display area of the display panel, and the step of adjusting the data amount of the image data of the frame by referring to the data rate that is used to transmit the image data of the frame comprises:

for each frame to be transmitted to the source driver, adjusting data amount of the inactive data of the frame by referring to the modulated data rate that is used to transmit the image data of the frame.

7. The method of claim 6, wherein the step of adjusting the data amount of the inactive data of the frame by referring to the modulated data rate that is used to transmit the image data of the frame comprises:

for each frame to be transmitted to the source driver, adjusting data amount of vertical blanking interval (VBI) data and/or horizontal blanking interval (HBI) data of the frame by referring to the modulated data rate that is used to transmit the image data of the frame.

8. The method of claim 5, wherein for any two frames, the frame to be transmitted with higher modulated data rate has greater data amount.

9. A timing controller of a display, for applying a plurality of data rates to a discrete data rate setting, wherein the plurality data rates are not all the same; and transmitting image data of a plurality of consecutive frames by using a plurality of modulated data rates, respectively; wherein the plurality of modulated data rates are generated by performing spread-spectrum clocking (SSC) upon the plurality of data rates, respectively, wherein for the transmission of each frame, a clock generator is controlled to generate a clock signal whose frequency is equal to a center frequency of the corresponding modulated data rate, and the clock signal is used to transmit the frame; and for each of the frames, its corresponding image data is transmitting by using only one of the modulated data rates; wherein the plurality of data rates comprise at least a first data rate and a second data rate, the first data rate and the second data rate are discrete data rates, the plurality of modulated data rates comprise a first modulated data rate and a second modulated data rate, the first modulated data rate and the second modulated data rate are used to transmit two consecutive frames, respectively; and the first modulated data rate is generated by performing the SSC upon the first data rate serving as the center frequency of the first modulated data rate, and the second modulated data rate is generated by performing the SSC upon the second data rate serving as the center frequency of the second modulated data rate.

10. The timing controller of claim 9, wherein the plurality of data rates serve as center frequencies of the plurality of modulated data rates, respectively.

11. The timing controller of claim 9, wherein the image data of any two adjacent frames is transmitted by using different modulated data rates having different center frequencies, respectively.

12. The timing controller of claim 9, wherein the timing controller repeatedly and sequentially uses the plurality of modulated data rates to transmit the image data of the plurality of frames.

13. The timing controller of claim 9, wherein for each frame to be transmitted to the source driver, the timing controller adjusts data amount of the image data of the frame by referring to the modulated data rate that is used to transmit the image data of the frame.

14. The timing controller of claim 13, wherein each frame comprises active image data and inactive data, the active image data is used to be displayed on an active display area of a display panel, the inactive data is not displayed on the active display area of the display panel, and for each frame to be transmitted to the source driver, the timing controller adjusts data amount of the inactive data of the frame by referring to the modulated data rate that is used to transmit the image data of the frame.

15. The timing controller of claim 14, wherein for each frame to be transmitted to the source driver, the timing controller adjusts data amount of vertical blanking interval (VBI) data and/or horizontal blanking interval (HBI) data of the frame by referring to the modulated data rate that is used to transmit the image data of the frame.

16. The timing controller of claim 13, wherein for any two frames, the frame to be transmitted with higher modulated data rate has greater data amount.

17. The timing controller of claim 9, wherein the timing controller comprises:

a clock generator, comprising:
a phase detector, for receiving a reference signal and a feedback signal to generate a detection result;
a charge pump, for generating a control signal according to the detection result;
a low-pass filter, for filtering the control signal to generate a filtered control signal;
an oscillator, for generating a clock signal according to the control signal;
a frequency divider, for generating the feedback signal according to the clock signal;
a hopping frequency control circuit, for controlling the oscillator to generate the clock signal whose center frequency is equal to one of the plurality of data rates; and
a SSC control circuit, for controlling the frequency divider to constantly change a frequency of the feedback signal, to make the clock signal whose frequency is equal to the plurality of modulated data rates; and
a transmitter, for using the clock signal to transmit the image data.

18. A display system, comprising:
a timing controller; and
at least one source driver;
wherein the timing controller is arranged for applying a plurality of data rates to a discrete data rate setting, wherein the plurality data rates are not all the same; and transmitting image data of a plurality of consecutive frames by using a plurality of modulated data rates, respectively, wherein for the transmission of each frame, a clock generator is controlled to generate a clock signal whose frequency is equal to a center frequency of the corresponding modulated data rate, and the timing controller uses the clock signal to transmit the frame; wherein the plurality of modulated data rates are generated by performing spread-spectrum clocking (SSC) upon the plurality of data rates, respectively; and for each of the frames, its corresponding image data is transmitting by using only one of the modulated data rates; wherein the plurality of data rates comprise at least a first data rate and a second data rate, the first data rate and the second data rate are discrete data rates, the plurality of modulated data rates comprise a first modulated data rate and a second modulated data rate, the first modulated data rate and the second modulated data rate are used to transmit two consecutive frames, respectively; and the first modulated data rate is generated by performing the SSC upon the first data rate serving as the center frequency of the first modulated data rate, and the second modulated data rate is generated by performing the SSC upon the second data rate serving as the center frequency of the second modulated data rate.

19. The display system of claim 18, wherein the plurality of data rates serve as center frequencies of the plurality of modulated data rates, respectively.

20. The display system of claim 18, wherein the image data of any two adjacent frames is transmitted by using different modulated data rates having different center frequencies, respectively.

* * * * *